US012666653B2

(12) United States Patent
He et al.

(10) Patent No.: US 12,666,653 B2
(45) Date of Patent: Jun. 23, 2026

(54) METAL OXIDE THIN FILM TRANSISTOR, ARRAY SUBSTRATE AND DISPLAY DEVICE

(71) Applicant: BOE TECHNOLOGY GROUP CO., LTD., Beijing (CN)

(72) Inventors: Jiayu He, Beijing (CN); Yan Qu, Beijing (CN); Liping Lei, Beijing (CN); Ce Ning, Beijing (CN); Zhengliang Li, Beijing (CN); Hehe Hu, Beijing (CN); Jie Huang, Beijing (CN); Nianqi Yao, Beijing (CN); Kun Zhao, Beijing (CN); Feifei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 414 days.

(21) Appl. No.: 18/028,114

(22) PCT Filed: Mar. 30, 2022

(86) PCT No.: PCT/CN2022/084064
§ 371 (c)(1),
(2) Date: Mar. 23, 2023

(87) PCT Pub. No.: WO2023/184236
PCT Pub. Date: Oct. 5, 2023

(65) Prior Publication Data
US 2024/0304698 A1     Sep. 12, 2024

(51) Int. Cl.
*H10D 30/67*      (2025.01)
*G02F 1/1368*     (2006.01)
(Continued)

(52) U.S. Cl.
CPC ....... *H10D 30/6739* (2025.01); *G02F 1/1368* (2013.01); *H10D 30/6755* (2025.01);
(Continued)

(58) Field of Classification Search
CPC ...... H10D 86/423; H10D 86/60; H10D 30/67; H10D 30/507; H10D 30/6739; H10D 30/6755; H10D 20/6757; G02F 1/136277
See application file for complete search history.

(56) References Cited

U.S. PATENT DOCUMENTS

2001/0015438 A1     8/2001  Callegari et al.
2004/0061179 A1*    4/2004  Carroll ............... H10D 84/0184
                                                      257/E21.324
(Continued)

FOREIGN PATENT DOCUMENTS

CN          102610618 A      7/2012
CN          203367288 U     12/2013
(Continued)

*Primary Examiner* — Galina G Yushina
(74) *Attorney, Agent, or Firm* — Nath, Goldberg & Meyer; Joshua B. Goldberg

(57) ABSTRACT

There is provided a metal oxide thin film transistor, including: a substrate and a metal oxide semiconductor layer on the substrate; a gate and a gate insulating layer between the substrate and the metal oxide semiconductor layer; the gate insulating layer includes a first silicon nitride layer, a second silicon nitride layer and a first silicon oxide layer which are stacked; the first silicon oxide layer is in contact with the metal oxide semiconductor layer, and two surfaces of the second silicon nitride layer are in contact with the first silicon nitride layer and the first silicon oxide layer, respectively; a content of hydrogen atoms of at least a partial region of the second silicon nitride layer is less than 30% of a content of hydrogen atoms of at least a partial region of the first silicon nitride layer. An array substrate and a display device are further provided.

16 Claims, 1 Drawing Sheet

(51) Int. Cl.
_H10D 86/40_ (2025.01)
_H10D 86/60_ (2025.01)

(52) U.S. Cl.
CPC ....... _H10D 30/6757_ (2025.01); _H10D 86/423_ (2025.01); _H10D 86/60_ (2025.01)

(56) References Cited

U.S. PATENT DOCUMENTS

| | | | | |
|---|---|---|---|---|
| 2007/0048957 | A1* | 3/2007 | Lee | H10D 30/69 257/E21.21 |
| 2007/0215958 | A1* | 9/2007 | Tanaka | H10D 30/69 257/411 |
| 2013/0299820 | A1* | 11/2013 | Miyamoto | H10D 64/665 257/43 |
| 2014/0346496 | A1* | 11/2014 | Ro | H10D 86/451 257/43 |
| 2017/0317217 | A1* | 11/2017 | Ito | H10D 30/6734 |
| 2021/0040607 | A1* | 2/2021 | Han | H10B 43/20 |

FOREIGN PATENT DOCUMENTS

| | | | | | |
|---|---|---|---|---|---|
| CN | 104285302 | A | 1/2015 | | |
| CN | 104300007 | A | 1/2015 | | |
| CN | 105239047 | * | 2/2016 | ............ | C23C 14/35 |
| CN | 109192784 | A | 1/2019 | | |
| CN | 112909087 | A | 6/2021 | | |
| CN | 113519065 | A | 10/2021 | | |
| CN | 112809182 | A | 12/2021 | | |
| JP | 2005045139 | A | 2/2005 | | |
| JP | 2014-30014 | A | 2/2014 | | |
| JP | 2016-105444 | A | 6/2016 | | |
| JP | 2016111203 | A | 6/2016 | | |
| KR | 20190044159 | * | 4/2019 | ....... | H01L 29/78618 |

* cited by examiner

METAL OXIDE THIN FILM TRANSISTOR, ARRAY SUBSTRATE AND DISPLAY DEVICE

This is a National Phase Application filed under 35 U.S.C. 371 as a national stage of PCT/CN2022/084064, filed Mar. 30, 2022, the content of which is hereby incorporated by reference in its entirety.

TECHNICAL FIELD

The present disclosure relates to the field of display technology, and particularly relates to a metal oxide thin film transistor, an array substrate and a display device.

BACKGROUND

Metal oxide thin film transistors have shown a gradually increasing market share in a high-end display market due to their relatively high mobility, and metal oxide technology is also considered to be the best possible implementation to replace the existing low temperature polysilicon technology. With the upgrading of display products, the development of metal oxide thin film transistors with ultra-high mobility (the mobility greater than 20 cm²/V.s and even to 50 m²/V.s) becomes the research and development focus of various panel manufacturers.

However, as a carrier mobility of metal oxide in the metal oxide thin film transistor being improved, the stability of the metal oxide thin film transistor is required to be higher and higher. In order to improve the stability of the metal oxide thin film transistor with a high-mobility material, more and more different manufacturing processes are used, and higher requirements are put on oxygen supplementing and hydrogen resisting capabilities of a gate insulating layer and a passivation layer.

SUMMARY

The present disclosure is directed to at least one of problems in the related art, and provides a metal oxide thin film transistor, an array substrate and a display device.

In a first aspect, the present disclosure provides a metal oxide thin film transistor, including: a substrate and a metal oxide semiconductor layer on the substrate; a Hall mobility of the metal oxide semiconductor layer is greater than or equal to 25 cm²/V.s; the metal oxide thin film transistor further includes: a gate electrode and a gate insulating layer between the substrate and the metal oxide semiconductor layer; the gate insulating layer includes: a first silicon nitride layer, a second silicon nitride layer and a first silicon oxide layer which are stacked; the first silicon oxide layer is in contact with the metal oxide semiconductor layer, and two surfaces of the second silicon nitride layer are in contact with the first silicon nitride layer and the first silicon oxide layer, respectively; a content of hydrogen atoms of at least a partial region of the second silicon nitride layer is less than 30% of a content of hydrogen atoms of at least a partial region of the first silicon nitride layer.

In some implementations, the content of hydrogen atoms of at least a partial region of the first silicon nitride layer ranges from $6.8 \times 10^{20}$ cm$^{-3}$ to $1.5 \times 10^{21}$ cm$^{-3}$; the content of hydrogen atoms of at least a partial region of the second silicon nitride layer ranges from $2.2 \times 10^{20}$ cm$^{-3}$ to $5.8 \times 10^{20}$ cm$^{-3}$.

In some implementations, the content of hydrogen atoms of at least a partial region of the first silicon oxide layer is less than 10% of the content of hydrogen atoms of at least a partial region of the second silicon nitride layer.

In some implementations, the content of hydrogen atoms of at least a partial region of the first silicon oxide layer ranges from $2.2 \times 10^{19}$ cm$^{-3}$ to $5.8 \times 10^{19}$ cm$^{-3}$.

In some implementations, a thickness of the second silicon nitride layer is less than 40% of a thickness of the first silicon nitride layer; the first silicon oxide layer has a thickness less than 60% of the thickness of the second silicon nitride layer.

In some implementations, the thickness of the first silicon nitride layer ranges from 150 nm to 300 nm; the thickness of the second silicon nitride layer ranges from 50 nm to 180 nm; the thickness of the first silicon oxide layer ranges from 30 nm to 150 nm.

In some implementations, a molar ratio of oxygen atoms to silicon atoms in at least a partial region of the first silicon oxide layer ranges from 2.0 to 3.0.

In some implementations, an atomic percentage of oxygen atoms in at least a partial region of the first silicon oxide layer ranges from 60% to 70%; an atomic percentage of silicon atoms in at least a partial region of the first silicon oxide layer ranges from 20% to 30%.

In some implementations, a molar ratio of nitrogen atoms to silicon atoms in at least a partial region of each of the first silicon nitride layer and the second silicon nitride layer ranges from 0.8 to 1.0.

In some implementations, an atomic percentage of nitrogen atoms in at least partial region of each of the first silicon nitride layer and the second silicon nitride layer ranges from 40% to 50%; an atomic percent of silicon atoms in at least partial region of each of the first silicon nitride layer and the second silicon nitride layer ranges from 40% to 50%.

In some implementations, an atomic percentage of oxygen atoms in at least a partial region of each of the first silicon nitride layer and the second silicon nitride layer ranges from 2.0% to 5.0%.

In some implementations, the metal oxide thin film transistor further includes a source electrode and a drain electrode above the metal oxide semiconductor layer, and a first passivation layer above the source electrode and the drain electrode; the first passivation layer includes a second silicon oxide layer and a third silicon nitride layer which are stacked; the second silicon oxide layer is in contact with the metal oxide semiconductor layer, the source electrode and the drain electrode; the third silicon nitride layer is in contact with the second silicon oxide layer; a content of hydrogen atoms of at least a partial region of the third silicon nitride layer is less than 30% of the content of hydrogen atoms of at least a partial region of the first silicon nitride layer.

In some implementations, the metal oxide thin film transistor further includes a second passivation layer above the first passivation layer; the second passivation layer includes a fourth silicon nitride layer; a content of hydrogen atoms of at least a partial region of the fourth silicon nitride layer is less than 30% of the content of hydrogen atoms of at least a partial region of the first silicon nitride layer.

In some implementations, the metal oxide thin film transistor further includes an organic insulating layer between the first passivation layer and the second passivation layer.

In some implementations, the metal oxide semiconductor layer includes a first metal oxide semiconductor layer, or a first metal oxide semiconductor layer and a second metal oxide semiconductor layer which are stacked; the second metal oxide semiconductor layer has a Hall mobility ranging from 50% to 60% of the Hall mobility of the first metal oxide semiconductor layer.

In some implementations, a thickness of the second metal oxide semiconductor layer ranges from 1 to 5 times the thickness of the first metal oxide semiconductor layer.

In a second aspect, the present disclosure provides an array substrate, which includes the metal oxide thin film transistor provided as above.

In a third aspect, the present disclosure provides a display device, which includes the metal oxide thin film transistor provided as above or the array substrate provided as above.

DETAILED DESCRIPTION

Figure 1:
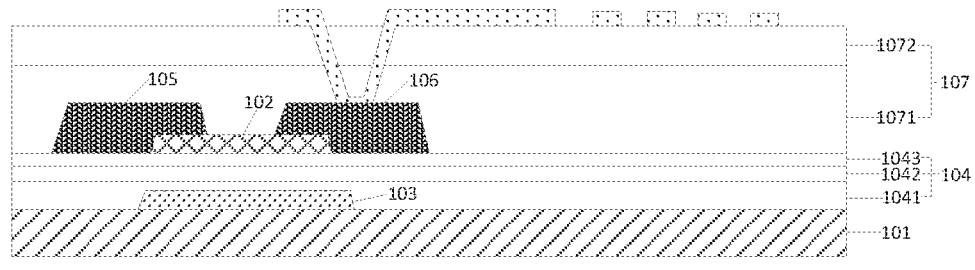
FIG. 1 is a schematic structural diagram of a metal oxide thin film transistor according to the present disclosure.

In order that those skilled in the art will better understand the technical solutions of the present disclosure, the following detailed description is given with reference to the accompanying drawings and specific implementations.

Unless defined otherwise, technical or scientific terms used herein shall have the ordinary meaning as understood by one of ordinary skill in the art to which the present disclosure belongs. The use of "first," "second," and the like in the present disclosure is not intended to indicate any order, quantity, or importance, but rather is used to distinguish one element from another. Also, the use of the terms "a," "an," or "the" and similar referents does not denote a limitation of quantity, but rather denotes the presence of at least one. The word "comprising/including" or "comprises/includes", and the like, means that the element or item preceding the word contains the element or item listed after the word and its equivalent, but does not exclude other elements or items. The terms "connected" or "coupled" and the like are not restricted to physical or mechanical connections, but may include electrical connections, whether direct or indirect. Terms "upper/on/above", "lower/below/under", "left", "right", and the like are used only to indicate relative positional relationships, and if an absolute position of the object being described is changed, the relative positional relationships may be changed accordingly.

As a novel thin film transistor, the metal oxide thin film transistor may be applied to technologies such as a Liquid Crystal Display (LCD) panel, an Organic Light-Emitting Diode (OLED) display panel, a Mini Light-Emitting Diode (Mini Light-Emitting Diode) backlight or display panel, and a Quantum Dot Light Emitting Diode (QLED) display panel.

The relatively high mobility of the existing metal oxide thin film transistor is mainly determined by characteristics of the material of the metal oxide semiconductor layer, and taking the metal oxide in the metal oxide thin film transistor being indium gallium zinc oxide (IGZO) as an example, the oxygen (O) element and metal elements indium (In), gallium (Ga) and zinc (Zn) can form a compound, and provide or trap carriers (oxygen vacancies) according to a condition of chemical bonding. Indium (In) can provide an electron transport path, so that IGZO has a high mobility. Gallium (Ga) has high ionization energy, and can suppress electron mobility, suppress formation of oxygen vacancies and generation of new mobile electrons. Zinc (Zn) can be used as a stabilizer, has strong chemical bonds to be combined with oxygen ions, and can form a stable tetrahedral structure to form a relatively stable amorphous grain boundary. As can be seen from characteristics of elements of IGZO in the metal oxide semiconductor layer, the metal oxide thin film transistor including IGZO can have a high mobility.

In the metal oxide thin film transistor, in addition to the metal oxide semiconductor layer, film layers such as a gate electrode, a gate insulating layer, a source electrode, a drain electrode and a passivation layer are generally provided, and in order to improve the stability of the metal oxide thin film transistor with a high-mobility material, the film layers such as the gate insulating layer and the passivation layer are desired to have relatively strong oxygen supplementing and hydrogen resisting capabilities, so as to prevent hydrogen atoms from damaging the metal oxide semiconductor layer. However, the gate insulating layer and the passivation layer in the existing metal oxide thin film transistor has relatively low oxygen supplementing and hydrogen resisting capabilities, which easily affects the stability of the metal oxide thin film transistor, and reduces the service life of the metal oxide thin film transistor.

In order to solve at least one of above technical problems, the present disclosure provides a metal oxide thin film transistor, an array substrate and a display device, and the metal oxide thin film transistor, the array substrate and the display device provided in the present disclosure will be described in further detail with reference to the accompanying drawings and implementations.

FIG. 1 is a schematic structural diagram of a metal oxide thin film transistor according to the present disclosure, and as shown in FIG. 1, the thin film transistor includes a substrate 101, a metal oxide semiconductor layer 102 on the substrate 101; a Hall mobility of the metal oxide semiconductor layer 102 is greater than or equal to 25 $cm^2/V.s$; the metal oxide thin film transistor further includes a gate electrode 103 and a gate insulating layer 104 between the substrate 101 and the metal oxide semiconductor layer 102; the gate insulating layer 104 includes a first silicon nitride layer 1041, a second silicon nitride layer 1042 and a first silicon oxide layer 1043 which are stacked; the first silicon oxide layer 1043 is in contact with the metal oxide semiconductor layer 102, and two surfaces of the second silicon nitride layer 1042 are in contact with the first silicon nitride layer 1041 and the first silicon oxide layer 1043, respectively; a content of hydrogen atoms of at least a partial region of the second silicon nitride layer 1042 is less than 30% of a content of hydrogen atoms of at least a partial region of the first silicon nitride layer 1041.

The substrate 101 may be made of a rigid material such as glass, which can improve a carrying capacity of the substrate 101 for other film layers thereon. Certainly, the substrate 101 may also be made of a flexible material such as Polyimide (PI), which can improve the overall bending resistance and tensile resistance of the metal oxide thin film transistor, and avoid the substrate 101 from being broken due to a stress generated during the metal oxide thin film transistor being bent, stretched, or twisted to cause a defect of broken circuit. In practical applications, the material of the substrate 101 may be selected reasonably as desired, so as to ensure that the metal oxide thin film transistor has good performance.

The metal oxide semiconductor layer 102 may be made of at least one of Indium Gallium Zinc Oxide (IGZO), Indium Gallium Tin Oxide (IGTO), Indium Zinc Oxide (IZO), Indium Tin Oxide (ITO), or Indium Tin Zinc Oxide (ITZO), which are all metal oxides with high mobility, so as to ensure that the overall metal oxide thin film transistor has a high mobility. In the present disclosure, the material of the metal oxide semiconductor layer 102 being IGZO is taken as an example for illustration, and the metal oxide semiconductor layer 102 has a the Hall mobility greater than or equal to 25 $cm^2/V.s$.

The gate electrode 103 may be made of at least one material selected from gold (Au), silver (Ag), copper (Cu), nickel (Ni), platinum (Pt), palladium (Pd), aluminum (Al), molybdenum (Mo), or chromium (Cr), and may be formed into a single-layer structure made of a single material, for example, a single-layer structure made of aluminum (Al), or may be formed into a multi-layer structure made of multiple different materials, for example, a three-layer structure made of molybdenum (Mo), aluminum (Al), and molybdenum (Mo). The gate electrode 103 can make the metal oxide semiconductor layer 102 conductive in response to a control signal input thereto, so that a data signal, a reset signal, an initialization signal, or the like can be input. It is understood that other film layers such as a buffer layer and a barrier layer may be further disposed between the substrate 101 and the gate electrode 103, to prevent water, oxygen, and the like from entering the metal oxide semiconductor layer 103 from a side where the substrate 101 is located, and may be made through processes by using materials in the related art, which are not described herein.

The gate insulating layer 104 may have a multi-layer structure, for example, a three-layer structure including a first silicon nitride layer 1041, a second silicon nitride layer 1042 and a first silicon oxide layer 1043, the first silicon oxide layer 1043 may be in direct contact with the metal oxide semiconductor layer 102, the first silicon nitride layer 1041 and the second silicon nitride layer 1042 are in direct contact with each other, and the second silicon nitride layer 1042 is in direct contact with the first silicon oxide layer 1043.

The first silicon oxide layer 1043 can directly protect the metal oxide semiconductor layer 102, however, due to characteristics of the material of the first silicon oxide layer 1043, the first silicon oxide layer 1043 is brittle, and thus generally the first silicon oxide layer 1043 is to be used in cooperation with a silicon nitride layer to increase the overall flexibility of the gate insulating layer 104, so as to avoid an occurrence of short circuit between the metal oxide semiconductor layer 102 and the gate electrode 103 due to a breakage of the gate insulating layer 104 in an application process, thereby preventing the performance of the metal oxide thin film transistor from being affected.

Due to limitations of materials and manufacturing processes of film layers in the gate insulating layer 104, hydrogen atoms may remain in the film layers to a greater or lesser extent, and the first silicon nitride layer 1041 may be formed by using a reaction gas through a chemical vapor deposition method, which may increase the overall flexibility of the gate insulating layer 104, however, a large amount of hydrogen atoms may remain in the first silicon nitride layer 1041 during the manufacturing process.

In order to prevent hydrogen atoms in the first silicon nitride layer 1041 from invading into the metal oxide semiconductor layer 102 and damaging the metal oxide semiconductor layer 102, the second silicon nitride layer 1042 is further disposed between the first silicon nitride layer 1041 and the first silicon oxide layer 1043, and the second silicon nitride layer 1042 may be formed by a chemical vapor deposition method using a reactive gas substantially not containing hydrogen atoms. The content of hydrogen atoms of at least a partial region of the second silicon nitride layer 1042 is less than 30% of the content of hydrogen atoms of at least a partial region of the first silicon nitride layer 1041. In practical applications, the second silicon nitride layer 1042 may be prepared by using a reaction gas, such as trisilicamine and nitrogen, substantially not containing hydrogen atoms, so as to avoid a high content of hydrogen atoms remaining in the second silicon nitride layer 1042, thereby avoiding the hydrogen atoms from damaging the metal oxide semiconductor layer 102, and further improving the stability of the entire metal oxide thin film transistor, and improving the service life of the entire metal oxide thin film transistor.

Moreover, the gate insulating layer 104 with the three-layer structure may be manufactured by using a same mask plate, so that no mask and no etching process need to added in the manufacturing process, and the process steps are not increased, so that the manufacturing cost is not increased. It is to be understood that the gate insulating layer 104 may also be formed into a structure including four layers, five layers, or any other number of layers, and the implementation principle thereof is similar to that described above and will not be described herein again.

In some implementations, the content of hydrogen atoms of at least a partial region of the first silicon nitride layer 1041 ranges from $6.8 \times 10^{20}$ $cm^{-3}$ to $1.5 \times 10^{21}$ $cm^{-3}$; the content of hydrogen atoms of at least a partial region of the second silicon nitride layer 1042 ranges from $2.2 \times 10^{20}$ $cm^{-3}$ to $5.8 \times 10^{20}$ $cm^{-3}$.

The content of hydrogen atoms of at least a partial region of the second silicon nitride layer 1042 is far less than the content of hydrogen atoms of at least a partial region of the first silicon nitride layer 1041, the content of hydrogen atoms of at least a partial region of the second silicon nitride layer 1042 is generally $10^{20}$ orders of magnitude, and the content of hydrogen atoms of at least a partial region of the first silicon nitride layer 1041 is generally $10^{21}$ orders of magnitude, and thus, the content of hydrogen atoms of at least a partial region of the second silicon nitride layer 1042 is less, so that a situation that a large number of hydrogen atoms in the first silicon nitride layer 1041 are conducted to the metal oxide semiconductor layer 102 to damage the metal oxide semiconductor layer is avoided, the stability of the whole metal oxide thin film transistor is improved, and the service life of the whole metal oxide thin film transistor is prolonged.

In some implementations, the content of hydrogen atoms of at least a partial region of the first silicon oxide layer 1043 is less than 10% of the content of hydrogen atoms of at least a partial region of the second silicon nitride layer 1042.

In practical applications, monosilane and nitrous oxide may be utilized to form the first silicon oxide layer 1043 by a chemical vapor deposition method, the above-mentioned reaction gases, i.e., monosilane and nitrous oxide, do not contain hydrogen atoms, and during the manufacturing process, no hydrogen ions are introduced, the content of hydrogen atoms of at least a partial region of the formed first silicon oxide layer 1043 is less than the content of hydrogen atoms of at least a partial region of the second silicon nitride layer 1042, as can be seen from above, the content of hydrogen atoms of at least a partial region of the second silicon nitride layer 1042 is relatively low, therefore, the content of hydrogen atoms of at least a partial region of the first silicon oxide layer 1043 is lower or even almost zero, which further avoids the large amount of hydrogen atoms in the first silicon nitride layer 1041 from being conducted to the metal oxide semiconductor layer 102 to damage the metal oxide semiconductor layer 102, thereby improving the stability of the whole metal oxide thin film transistor, and simultaneously, the service life of the whole metal oxide thin film transistor can be prolonged. Specifically, the content of hydrogen atoms of at least a partial region of the first silicon oxide layer 1043 may range from $2.2 \times 10^{19}$ cm$^{-3}$ to $5.8 \times 10^{19}$ cm$^{-3}$. It can be understood that, another reaction gas and a new process may also be used, so that the content of hydrogen atoms of at least a partial region of the first silicon oxide layer 1043 is lower, and even reaches 0, thus the metal oxide semiconductor layer 102 is protected and the hydrogen atoms are prevented from damaging the metal oxide semiconductor layer 102, thereby improving the stability of the entire metal oxide thin film transistor and the service life of the entire metal oxide thin film transistor.

In some implementations, a thickness of the second silicon nitride layer 1042 is less than 40% of a thickness of the first silicon nitride layer 1041; a thickness of the first silicon oxide layer 1043 is less than 60% of the thickness of the second silicon nitride layer 1042.

The first silicon nitride layer 1041 in the metal oxide thin film transistor has a relatively large thickness, which can relieve the flexibility of the whole gate insulating layer 104, and avoid the gate insulating layer 104 from being broken to cause a short circuit between the metal oxide semiconductor layer 102 and the gate 103, thereby avoiding the performance of the metal oxide thin film transistor being affected. The thickness of the second silicon nitride layer 1042 is less than that of the first silicon nitride layer 1041, and the content of hydrogen atoms in the second silicon nitride layer 1042 is lower, which can prevent the large amount of hydrogen atoms in the first silicon nitride layer 1041 from being conducted to the metal oxide semiconductor layer 102 to damage the metal oxide semiconductor layer 102, thereby improving the stability of the whole metal oxide thin film transistor and prolonging the service life of the whole metal oxide thin film transistor. The thickness of the first silicon oxide layer 1043 is less than that of the second silicon nitride layer 1042, and the first silicon oxide layer 1043 is in direct contact with the metal oxide semiconductor layer 102, so as to protect the metal oxide semiconductor layer 102, prevent hydrogen atoms from damaging the metal oxide semiconductor layer 102, and prevent the thickness of the entire gate insulating layer 104 from being too large to affect the performance of the metal oxide thin film transistor. Specifically, the thickness of the first silicon nitride layer 1041 ranges from 150 nm to 300 nm; the thickness of the second silicon nitride layer 1042 ranges from 50 nm to 180 nm; the thickness of the first silicon oxide layer 1043 ranges from 30 nm to 150 nm. In some implementations, in the metal oxide thin film transistor provided by the present disclosure, the thickness of the first silicon nitride layer 1041 may be about 218.4 nm, the thickness of the second silicon nitride layer 1042 may be about 88.45 nm, and the thickness of the first silicon oxide layer 1043 may be about 52.88 nm. It is to be understood that thicknesses of respective film layers in the gate insulating layer 104 may be set as desired, and are not listed here.

It is to be noted that a thickness of the metal oxide semiconductor layer 102 ranges from 2 nm to 70 nm. If the thickness of the metal oxide semiconductor layer 102 is too small, the Hall mobility thereof cannot satisfy an expectation of high mobility, and if the thickness of the metal oxide semiconductor layer 102 is too large, the metal oxide semiconductor layer 102 is easily to be conductive, which affects the performance of the metal oxide thin film transistor. In some implementations, the thickness of the metal oxide semiconductor layer 102 in the metal oxide thin film transistor provided by the present disclosure may be about 10 nm. It is to be understood that the thickness of the metal oxide semiconductor layer 102 may be appropriately set according to different materials, and is not listed here.

In some implementations, a molar ratio of oxygen atoms to silicon atoms in at least a partial region of the first silicon oxide layer 1043 ranges from 2.0 to 3.0.

The first silicon oxide layer 1043 has a relatively large content of oxygen atoms in at least a partial region thereof, and the oxygen atoms may be conducted into the metal oxide semiconductor layer 102 to supplement oxygen to the metal oxide semiconductor layer 102, so as to avoid the influence on the performance of the metal oxide thin film transistor caused by the loss of oxygen atoms of the metal oxide semiconductor layer 102 and the metal oxide semiconductor layer 102 being conductive during manufacturing and application processes, thereby improving the performance of the metal oxide thin film transistor and prolonging the service life of the whole metal oxide thin film transistor. Specifically, an atomic percentage of oxygen atoms in at least a partial region of the first silicon oxide layer 1043 ranges from 60% to 70%; an atomic percentage of silicon atoms in at least a partial region of the first silicon oxide layer ranges from 20% to 30%. In some implementations, the molar ratio of oxygen atoms to silicon atoms in at least a partial region of the first silicon oxide layer 1043 may be about 2.18, for example, the atomic percentage of oxygen atoms in the first silicon oxide layer 1043 is about 67.23%, and the atomic percentage of silicon atoms in the first silicon oxide layer 1043 is about 30.74%, so as to ensure a relatively strong oxygen supplementing capacity.

In some implementations, the molar ratio of nitrogen atoms to silicon atoms in at least a partial region of each of the first silicon nitride layer 1041 and the second silicon nitride layer 1042 ranges from 0.8 to 1.0.

In at least a partial region of each of the first silicon nitride layer 1041 and the second silicon nitride layer 1042, the content of nitrogen atoms is relatively close to the content of silicon atoms, specifically, the atomic percentage of nitrogen atoms in at least a partial region of each of the first silicon nitride layer 1041 and the second silicon nitride layer 1042 ranges from 40% to 50%; the atomic percentage of silicon atoms in at least a partial region of each of the first silicon nitride layer 1041 and the second silicon nitride layer 1042 ranges from 40% to 50%. In some implementations, the content of nitrogen atoms in each of the first silicon nitride layer 1041 and the second silicon nitride layer 1042 may be about 48.35%, and the content of silicon atoms in each of the first silicon nitride layer 1041 and the second silicon nitride layer 1042 may be about 47.2%, so as to ensure that the first silicon nitride layer 1041 and the second silicon nitride layer 1042 each have good insulating property and good flexibility.

In some implementations, the atomic percentage of oxygen atoms in at least a partial region of each of the first silicon nitride layer 1041 and the second silicon nitride layer 1042 ranges from 2.0% to 5.0%.

The first silicon nitride layer 1041 and the second silicon nitride layer 1042 each contain a small amount of oxygen atoms, specifically, each of the first silicon nitride layer 1041 and the second silicon nitride layer 1042 may have a content about 4.45% of oxygen atoms, so as to supplement oxygen to the metal oxide semiconductor layer 102 to a certain extent, and ensure the stable performance of the metal oxide thin film transistor.

In some implementations, the metal oxide thin film transistor further includes a source electrode 105 and a drain electrode 106 above the metal oxide semiconductor layer 102, and a first passivation layer 107 above the source electrode 105 and the drain electrode 106; the first passivation layer 107 includes a second silicon oxide layer 1071 and a third silicon nitride layer 1072 which are stacked; the second silicon oxide layer 1071 is in contact with the metal oxide semiconductor layer 102, the source electrode 105, and the drain electrode 106; the third silicon nitride layer 1072 is in contact with the second silicon oxide layer 1071; a content of hydrogen atoms of at least a partial region of the third silicon nitride layer 1072 is less than 30% of the content of hydrogen atoms of at least a partial region of the first silicon nitride layer 1041.

The source electrode 105 and the drain electrode 106 of the metal oxide thin film transistor may be above the metal oxide semiconductor layer 102, the source electrode 105 and the drain electrode 106 may be respectively connected to a partial region of the metal oxide semiconductor layer 102, and under a control signal input through the gate electrode 103, a current may be allowed between the source electrode 105 and the drain electrode 106 through the metal oxide semiconductor layer 102, i.e., the source electrode 105 may be conducted to the drain electrode 106 through the metal oxide semiconductor layer 102, thereby implementing a control function of the metal oxide thin film transistor. The first passivation layer 107 may cover the metal oxide semiconductor layer 102, the source electrode 105, and the drain electrode 106, the second silicon oxide layer 1071 in the first passivation layer 107 may be in direct contact with the metal oxide semiconductor layer 102, the third silicon nitride layer 1072 is in contact with the second silicon oxide layer 1071, and the second silicon oxide layer 1071 can protect the metal oxide semiconductor layer 102. Furthermore, the third silicon nitride layer 1072 contains a relatively low amount of hydrogen atoms, which can prevent the hydrogen atoms from being conducted to the metal oxide semiconductor layer 102 and damaging the metal oxide semiconductor layer, thereby improving the stability of the whole metal oxide thin film transistor and prolonging the service life of the whole metal oxide thin film transistor. It should be noted that parameters such as the material and the thickness of the third silicon nitride layer 1072 in the first passivation layer 107 may be the same as those of the second silicon nitride layer 1042 in the gate insulating layer 104, so as to lower the process difficulty and save the manufacturing cost.

Figure 2:
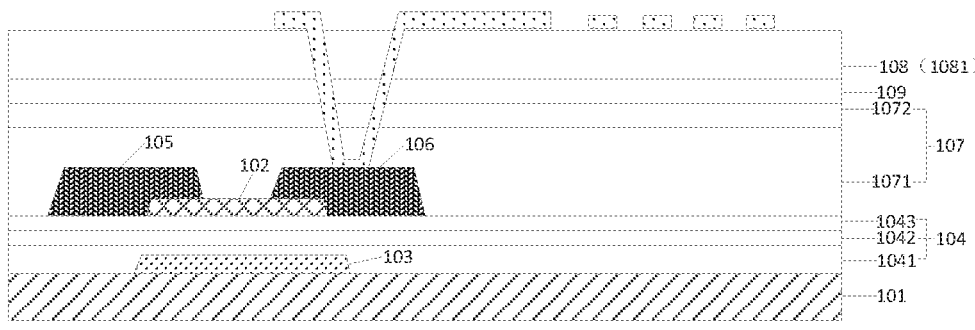
FIG. 2 is a schematic structural diagram of another metal oxide thin film transistor according to the present disclosure.

In some implementations, FIG. 2 is a schematic structural diagram of another metal oxide thin film transistor according to the present disclosure, and as shown in FIG. 2, the metal oxide thin film transistor further includes a second passivation layer 108 above the first passivation layer 107; the second passivation layer 108 includes a fourth silicon nitride layer 1081; a content of hydrogen atoms of at least a partial region of the fourth silicon nitride layer 1081 is less than 30% of the content of hydrogen atoms of at least a partial region of the first silicon nitride layer 1041.

In the present disclosure, the metal oxide thin film transistor may include double passivation layers, that is, the first passivation layer 107 and the second passivation layer 108, and the fourth silicon nitride layer 1081 in the second passivation layer 108 has a relatively low content of hydrogen atoms, so that the hydrogen atoms are prevented from being conducted to the metal oxide semiconductor layer 102 and damaging the metal oxide semiconductor layer 102, the stability of the entire metal oxide thin film transistor is further improved, and the service life of the entire metal oxide thin film transistor is improved. It should be noted that parameters such as the material and the thickness of the fourth silicon nitride layer 1081 in the second passivation layer 108 may be the same as those of the second silicon nitride layer 1042 in the gate insulating layer 104, so as to lower the process difficulty and save the manufacturing cost.

In some implementations, as shown in FIG. 2, the metal oxide thin film transistor further includes an organic insulating layer 109 between the first passivation layer 107 and the second passivation layer 108.

The organic insulating layer 109 has relatively strong flexibility, which can improve the flexibility of film layers in the first passivation layer 107 and the second passivation layer 108, and prevent the film layers in the first passivation layer 107 and the second passivation layer 108 from being broken in an application process, so that the performance of the metal oxide thin film transistor can be improved.

Figure 3:
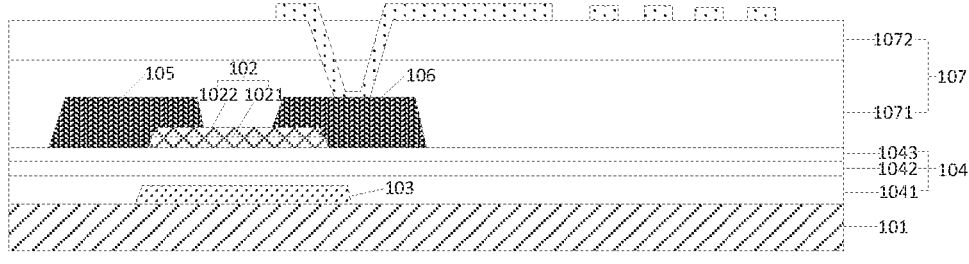
FIG. 3 is a schematic structural diagram of another metal oxide thin film transistor according to the present disclosure.
Figure 4:
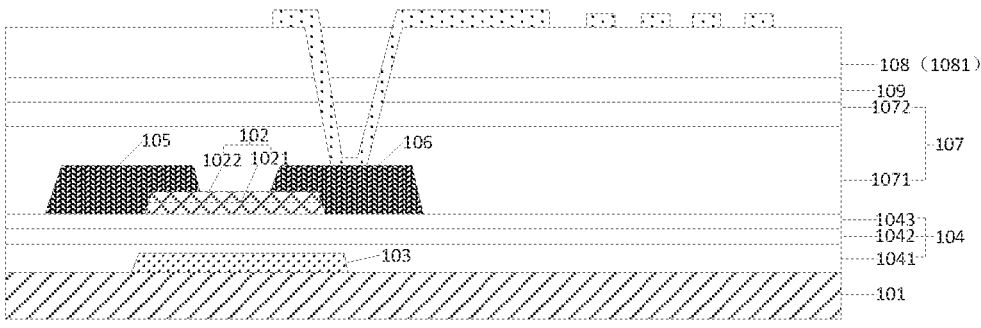
FIG. 4 is a schematic structural diagram of another metal oxide thin film transistor according to the present disclosure.

In some implementations, FIG. 3 is a schematic structural diagram of another metal oxide thin film transistor according to the present disclosure, and FIG. 4 is a schematic structural diagram of another metal oxide thin film transistor according to the present disclosure, and as shown in FIG. 3 and FIG. 4, the metal oxide semiconductor layer 102 includes a first metal oxide semiconductor layer 1021 (the metal oxide semiconductor layer 102 in the metal oxide thin film transistor shown in FIGS. 1 and 2 has a single-layer structure, and includes only the first metal oxide semiconductor layer 1021), or a first metal oxide semiconductor layer 1021 and a second metal oxide semiconductor layer 1022 which are stacked; a Hall mobility of the second metal oxide semiconductor layer 1022 ranges from 50% to 60% of the Hall mobility of the first metal oxide semiconductor layer 1021.

The metal oxide semiconductor layer 102 in the metal oxide thin film transistor may have a single-layer structure or a double-layer structure, the Hall mobility of the first metal oxide semiconductor layer 1021 is greater than or equal to 25 cm$^2$/V.s, so as to ensure that the overall metal oxide semiconductor layer 102 has a relatively large Hall mobility, and the Hall mobility of the second metal oxide semiconductor layer 1022 is relatively less than that of the first metal oxide semiconductor layer 1021, so that the second metal oxide semiconductor layer 1022 can protect the first metal oxide semiconductor layer 1021 without affecting the overall metal oxide semiconductor layer 102 to have a good Hall mobility, and avoids the influence of light, water, oxygen and the like on the first metal oxide semiconductor layer 1021, thereby improving the stability of the metal oxide thin film transistor and prolonging the service life of the metal oxide thin film transistor.

In some implementations, a thickness of the second metal oxide semiconductor layer 1022 ranges from 1 to 5 times the thickness of the first metal oxide semiconductor layer 1021.

The second metal oxide semiconductor layer 1022 can effectively protect the first metal oxide semiconductor layer 1021, and the thickness of the second metal oxide semiconductor layer 1022 is greater than that of the first metal oxide semiconductor layer 1021, so that the second metal oxide semiconductor layer 1022 can effectively protect the first metal oxide semiconductor layer 1021 below the second metal oxide semiconductor layer 1022, and can avoid the influence of light, water, oxygen and the like on the first metal oxide semiconductor layer 1021, thereby improving the stability of the metal oxide thin film transistor, and prolonging the service life of the metal oxide thin film transistor.

The present disclosure further provides an array substrate, including the metal oxide thin film transistor provided above, and the implementation principle and the beneficial effects of the array substrate are the same as those of the metal oxide thin film transistor provided above, and are not described herein again.

The present disclosure further provides a display device, which includes the metal oxide thin film transistor provided above or the array substrate provided above. The display device may be any product or component with a display function, such as a mobile phone, a tablet computer, a television, a display, a notebook computer, a digital photo frame, a navigator, or the like, and the implementation principle and the beneficial effect of the display device are the same as those of the metal oxide thin film transistor and the array substrate provided above, and are not described herein again.

It will be understood that the above implementations are merely exemplary implementations employed to illustrate the principles of the present disclosure, and the present disclosure is not limited thereto. It will be apparent to those skilled in the art that various changes and modifications can be made without departing from the spirit and scope of the present disclosure, and these changes and modifications are to be considered within the scope of the present disclosure.

The invention claimed is:

1. A metal oxide thin film transistor, comprising: a substrate and a metal oxide semiconductor layer on the substrate; a Hall mobility of the metal oxide semiconductor layer is greater than or equal to 25 $cm^2/V.s$;

the metal oxide thin film transistor further comprises a gate electrode and a gate insulating layer between the substrate and the metal oxide semiconductor layer;

the gate insulating layer comprises a first silicon nitride layer, a second silicon nitride layer and a first silicon oxide layer which are stacked, wherein the first silicon oxide layer is in contact with the metal oxide semiconductor layer, and two surfaces of the second silicon nitride layer are in contact with the first silicon nitride layer and the first silicon oxide layer, respectively;

a content of hydrogen atoms of at least a partial region of the second silicon nitride layer is less than 30% of a content of hydrogen atoms of at least a partial region of the first silicon nitride layer, wherein a content of hydrogen atoms of at least a partial region of the first silicon oxide layer is less than 10% of the content of hydrogen atoms of at least the partial region of the second silicon nitride layer, a thickness of the second silicon nitride layer is less than 40% of a thickness of the first silicon nitride layer, the first silicon oxide layer has a thickness less than 60% of the thickness of the second silicon nitride layer, wherein the metal oxide thin film transistor further comprises: a source electrode and a drain electrode above the metal oxide semiconductor layer, and a first passivation layer above the source electrode and the drain electrode, the first passivation layer comprises a second silicon oxide layer and a third silicon nitride layer which are stacked, the second silicon oxide layer is in contact with the metal oxide semiconductor layer, the source electrode and the drain electrode, the third silicon nitride layer is in contact with the second silicon oxide layer, a content of hydrogen atoms of at least a partial region of the third silicon nitride layer is less than 30% of the content of hydrogen atoms of at least a partial region of the first silicon nitride layer.

2. The metal oxide thin film transistor of claim 1, wherein the content of hydrogen atoms of at least a partial region of the first silicon nitride layer ranges from $6.8 \times 10^{20}$ $cm^{-3}$ to $1.5 \times 10^{21}$ $cm^{-3}$;

the content of hydrogen atoms of at least the partial region of the second silicon nitride layer ranges from $2.2 \times 10^{20}$ $cm^{-3}$ to $4.5 \times 10$ $cm^{-3}$.

3. The metal oxide thin film transistor of claim 1, wherein the content of hydrogen atoms of at least the partial region of the first silicon oxide layer ranges from $2.2 \times 10^{19}$ $cm^{-3}$ to $4.5 \times 10^{19}$ $cm^{-3}$.

4. The metal oxide thin film transistor of claim 1, wherein the thickness of the first silicon nitride layer ranges from 150 nm to 300 nm;

the thickness of the second silicon nitride layer ranges from 30 nm to 120 nm;

the thickness of the first silicon oxide layer ranges from 30 nm to 72 nm.

5. The metal oxide thin film transistor of claim 1, wherein a molar ratio of oxygen atoms to silicon atoms in at least a partial region of the first silicon oxide layer ranges from 2.0 to 3.0.

6. The metal oxide thin film transistor of claim 5, wherein an atomic percentage of oxygen atoms in at least a partial region of the first silicon oxide layer ranges from 60% to 70%;

an atomic percentage of silicon atoms in at least a partial region of the first silicon oxide layer ranges from 20% to 30%.

7. The metal oxide thin film transistor of claim 1, wherein a molar ratio of nitrogen atoms to silicon atoms in at least a partial region of each of the first silicon nitride layer and the second silicon nitride layer ranges from 0.8 to 1.0.

8. The metal oxide thin film transistor of claim 7, wherein the atomic percentage of nitrogen atoms in at least a partial region of each of the first silicon nitride layer and the second silicon nitride layer ranges from 40% to 50%;

an atomic percentage of silicon atoms in at least a partial region of each of the first silicon nitride layer and the second silicon nitride layer ranges from 40% to 50%.

9. The metal oxide thin film transistor of claim 1, wherein an atomic percentage of oxygen atoms in at least a partial region of each of the first silicon nitride layer and the second silicon nitride layer ranges from 2.0% to 5.0%.

10. The metal oxide thin film transistor of claim 1, further comprising: a second passivation layer above the first passivation layer;

the second passivation layer comprises a fourth silicon nitride layer;

a content of hydrogen atoms of at least a partial region of the fourth silicon nitride layer is less than 30% of the content of hydrogen atoms of at least a partial region of the first silicon nitride layer.

11. The metal oxide thin film transistor of claim 10, further comprising: an organic insulating layer between the first passivation layer and the second passivation layer.

12. The metal oxide thin film transistor of claim 1, wherein the metal oxide semiconductor layer comprises a first metal oxide semiconductor layer and a second metal oxide semiconductor layer which are stacked;

the second metal oxide semiconductor layer has a Hall mobility ranging from 50% to 60% of that of the first metal oxide semiconductor layer.

13. The metal oxide thin film transistor of claim 12, wherein a thickness of the second metal oxide semiconductor layer ranges from 1 to 5 times the thickness of the first metal oxide semiconductor layer.

14. An array substrate, comprising: the metal oxide thin film transistor of claim 1.

15. A display device, comprising: the metal oxide thin film transistor of claim 1.

16. A display device, comprising: the array substrate of claim 14.

* * * * *